United States Patent
Reblewski et al.

(10) Patent No.: US 6,874,136 B2
(45) Date of Patent: Mar. 29, 2005

(54) CROSSBAR DEVICE WITH REDUCED PARASITIC CAPACITIVE LOADING AND USAGE OF CROSSBAR DEVICES IN RECONFIGURABLE CIRCUITS

(75) Inventors: Frederic Reblewski, Paris (FR); Olivier Lepape, Paris (FR)

(73) Assignee: M2000, Saclay (FR)

( * ) Notice: Subject to any disclaimer, the term of this patent is extended or adjusted under 35 U.S.C. 154(b) by 0 days.

(21) Appl. No.: 10/043,964

(22) Filed: Jan. 10, 2002

(65) Prior Publication Data

US 2003/0131331 A1 Jul. 10, 2003

(51) Int. Cl.⁷ ............................ G06F 17/50; G06F 9/45
(52) U.S. Cl. ................. 716/10; 716/1; 716/12
(58) Field of Search ....................... 716/1–14

(56) References Cited

U.S. PATENT DOCUMENTS

| | | | |
|---|---|---|---|
| 5,260,610 A | | 11/1993 | Pedersen et al. ............... 326/41 |
| 5,517,186 A | | 5/1996 | Veenstra |
| 5,644,496 A | * | 7/1997 | Agrawal et al. ............... 716/17 |
| 5,717,871 A | * | 2/1998 | Hsieh et al. ................. 710/317 |
| 5,744,990 A | * | 4/1998 | Burstein et al. ............. 327/143 |
| 5,886,943 A | * | 3/1999 | Sekiguchi et al. ........... 365/230 |
| 6,175,952 B1 | * | 1/2001 | Patel et al. .................... 716/18 |
| 6,289,494 B1 | * | 9/2001 | Sample et al. ................ 716/12 |

FOREIGN PATENT DOCUMENTS

GB    2 300 085 A    10/1996

* cited by examiner

Primary Examiner—A. M. Thompson
Assistant Examiner—Sun James Lin
(74) Attorney, Agent, or Firm—Schwabe, Williamson & Wyatt, P.C.

(57) ABSTRACT

A crossbar device includes a first set of input lines and a second set of output lines. A plurality of chains of pass transistors are provided to selectively couple the input lines to the output lines in a reduced parasitic capacitive loading manner. Further, memory elements and decoder logic are provided to facilitate control of the selective coupling. Additionally, a low power application of multiple crossbar devices to a reconfigurable circuit block is improved by having each memory element of a crossbar device be provided with a supply voltage higher by a Vth to maintain the input voltage of corresponding output buffers at Vdd. Further, an application of multiple crossbar devices to a reconfigurable circuit block is improved by coupling a control circuitry via a control line to all output buffers of the interconnected crossbar devices to force the output buffers to a known state at power-on.

20 Claims, 7 Drawing Sheets

CROSSBAR DEVICE WITH REDUCED PARASITIC CAPACITIVE LOADING AND USAGE OF CROSSBAR DEVICES IN RECONFIGURABLE CIRCUITS

BACKGROUND OF THE INVENTION

1. Field of the Invention

The present invention relates to the field of integrated circuit (IC). More specifically, the present invention relates to crossbar devices, and their usage in reconfigurable circuits.

2. Background Information

Crossbar devices for programmatically connecting n inputs to m outputs, in general, are known in the art.

Figure 1A:
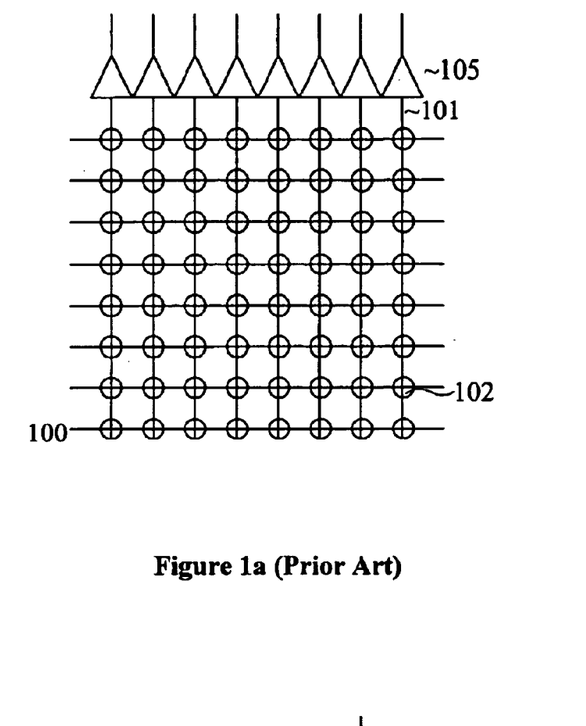
FIGS. 1a–1b illustrate a basic crossbar implementation known in the art.
Figure 1B:
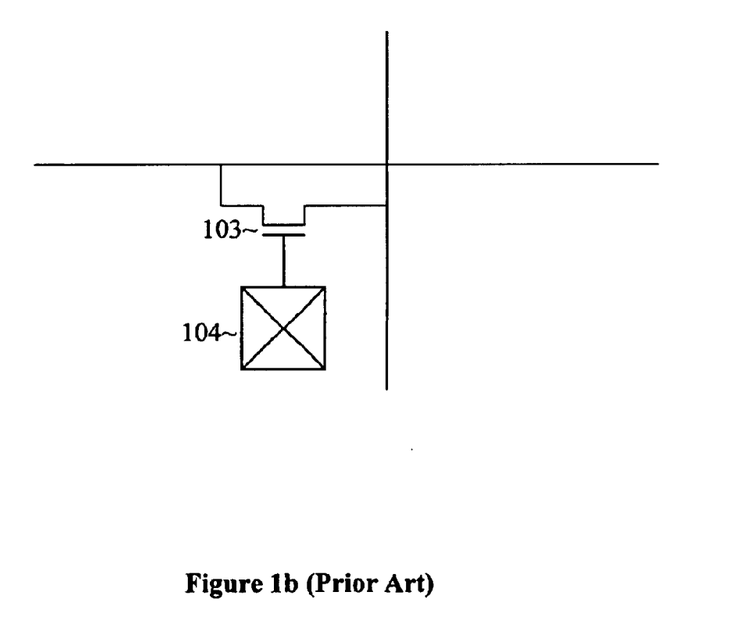

FIGS. 1a–1b show a basic implementation of a pass n-mos crossbar device known in the art. Input lines 100 are connectable to output lines 101 through switches 102. Each switch 102 comprises a n-mos pass transistor 103 with its source connected to one input line and its drain connected to one output line; and a memory element 104 controlling the gate of pass transistor 103. Connection between one input line and one output line is effectuated by applying a high voltage (by storing a 1 in the memory element) to the gate of the corresponding pass transistor; putting the pass transistor in a low resistance state between its source and drain. Output buffer 105 amplifies and regenerates the voltage level on the output line, restoring the pass transistor 103 threshold voltage (Vth) drop. The configuration of such a crossbar should connect only one input to one output, otherwise it can possibly create a short circuit between two inputs connected to the same output. This type of crossbar causes problems at power up if the memory element is unknown, possibly connecting several inputs to a same output. Also, this type of crossbar needs n×m memory elements to realize a n inputs to m outputs crossbar.

Figure 2:
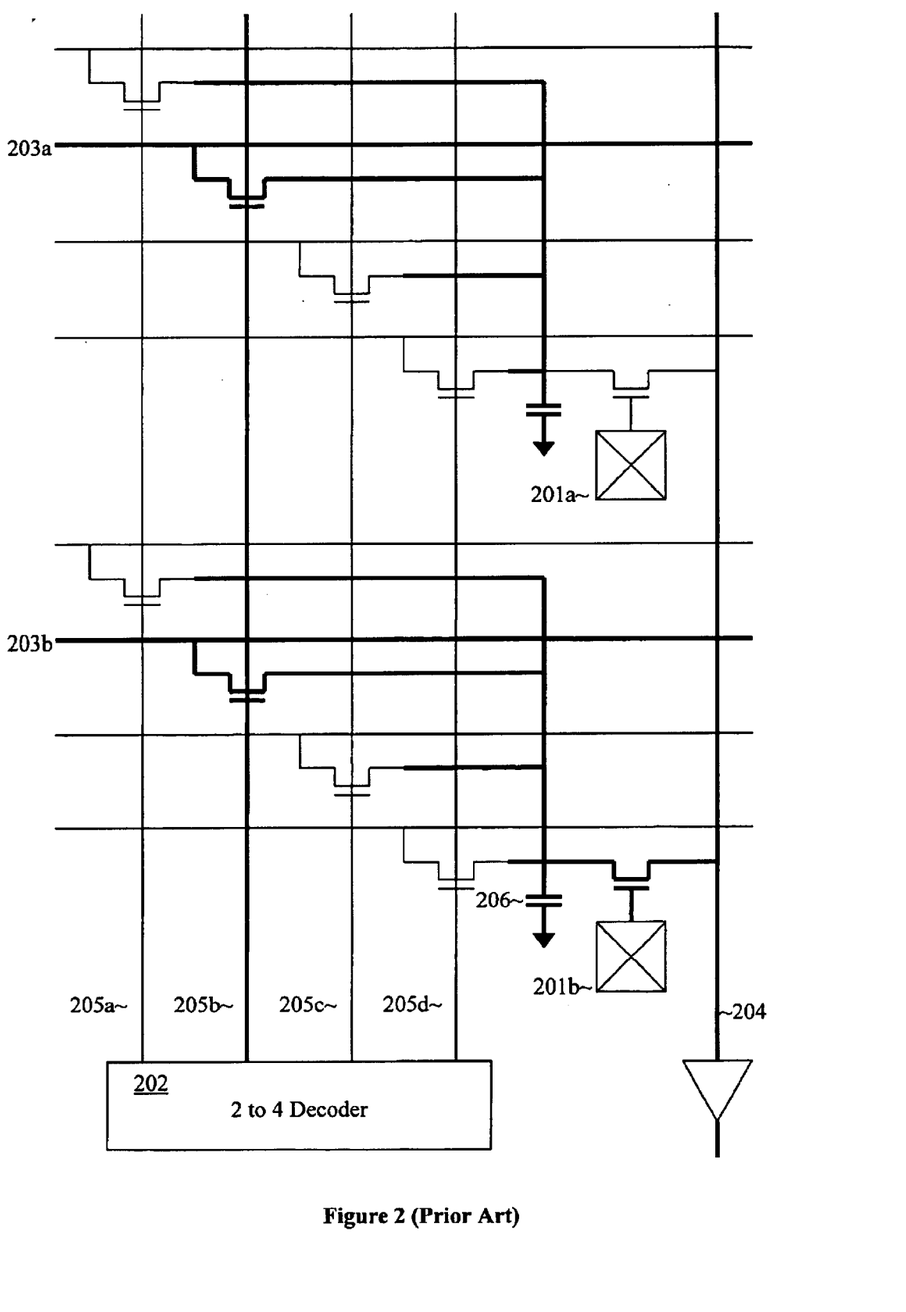
FIGS. 2–3 illustrate additional prior art implementations.

FIG. 2 shows another prior art implementation (U.S. Pat. No. 6,289,494) having a more efficient structure. This type of crossbar needs (n/4)×m memory elements 201 and m 2 to 4 decoders 202 to realize a n inputs to m outputs crossbar. For a large crossbar input number the penalty of the 2 to 4 decoder 202 is compensated by the reduction in the number of memory elements required. One problem with this architecture is the capacitive loading of the input lines. To connect input line 203a to output line 204 a 1 is programmed into memory element 201a, and the decoder drives a 1 on its output 205b. Therefore, input line 203b is connected to capacitor 206. Similarly, every fourth input of one column is connected to a capacitor 206. Note, the capacitive load of one input depends on the programming pattern of the other inputs, which could ends up with a high capacitive load on some input lines and a low capacitive load on some other input lines. Also, the capacitance 206 is pretty big because it represents the parasitic load of five n-mos drains/sources and the metal interconnections between these five n-mos drains/sources.

Figure 3:
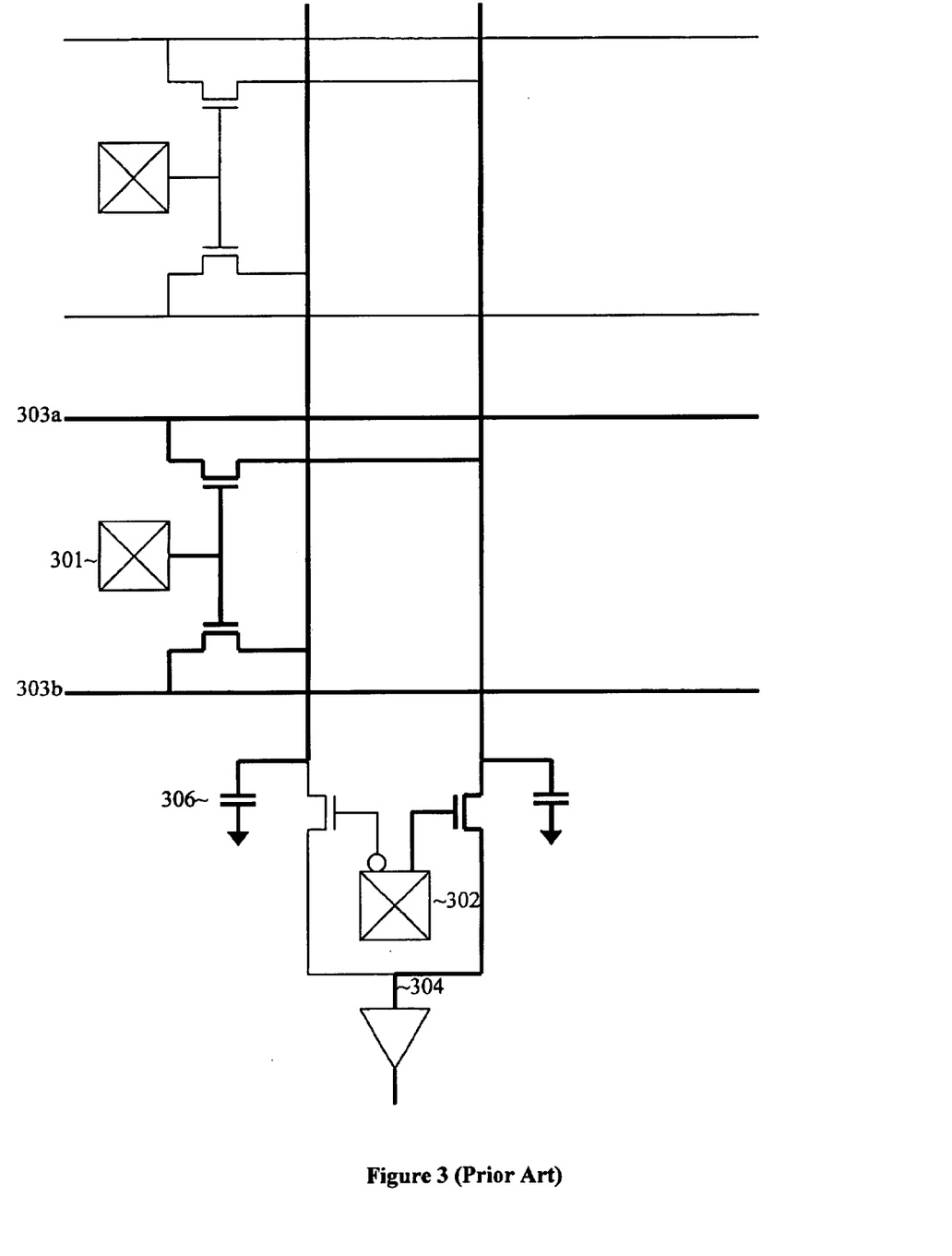

FIG. 3 shows another prior art implementation (U.S. Pat. No. 5,260,610). This type of crossbar also needs (n/2)×m memory elements 301 plus m memory elements 302. To connect input line 303a to output line 304 we must program a 1 in memory element 301 and a 1 in memory element 302. But, by programming a one in memory element 301, input line 303b is connected to capacitance 306. Capacitance 306 is large because it represents the parasitic load of half of the pass transistor of one column plus the metal interconnection between them. If the crossbar has 32 inputs, then capacitance 306 includes the parasitic load of 16 n-mos drains/sources. Again, the capacitive loading of one input line can vary dramatically with the programming pattern of the other inputs.

In applications where a significant number of crossbars are employed and interconnected, such as reconfigurable circuit applications, the input capacitive load variation of one crossbar input with respect to the programming pattern fits other inputs makes the timing optimization of high performance devices very difficult. Additionally, these and other prior art crossbar devices are found to consume more power and/or area than desired, as well as contributing to current swing.

Thus, a crossbar device and techniques of employment in reconfigurable circuit without at least some of these disadvantages are desired.

SUMMARY OF THE INVENTION

A crossbar device includes a first set of input conductor lines and a second set of output conductor lines. A plurality of chains of pass transistors are provided to selectively couple the input lines to the output lines in a reduced parasitic capacitive loading manner. Further, memory elements and decoder logic are provided to facilitate control of the selective coupling.

In one embodiment, each pass transistor chain comprises a first pass transistor with its source connected to one input line and its gate connected to a memory element, and a second pass transistor with its source connected to the drain of the first pass transistor, its gate connected to a decoder logic, and its drain connected to one output line. For each output line, the memory element selects a first group of inputs and the decoder selects one input out of the first group of inputs thereby establishing a connection between the selected input line and the output line.

In accordance with another aspect, a low power application of multiple crossbar devices to a reconfigurable circuit block is improved by having each memory element of a crossbar device be provided with a supply voltage higher by a threshold voltage Vth to maintain the supply voltage of corresponding output buffers input at Vdd, to prevent the output buffers from consuming static current when their inputs are at a degenerated level, to facilitate the lower power application.

In accordance with yet another aspect, an application of multiple crossbar devices to a reconfigurable circuit block is improved by coupling a control circuitry via a control line to all output buffers of the interconnected crossbar devices to force all output buffers of the crossbar devices to a known state at power-on, to prevent unpredictable behavior.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. In other instances, well-known features are omitted or simplified in order not to obscure the present invention.

Further, the phrase "in one embodiment" is used repeatedly. In general, the phrase does not refer to the same embodiment, although it may. The terms "comprising", "including", "having" and the like, as used in the present application, are synonymous.

Figure 4:
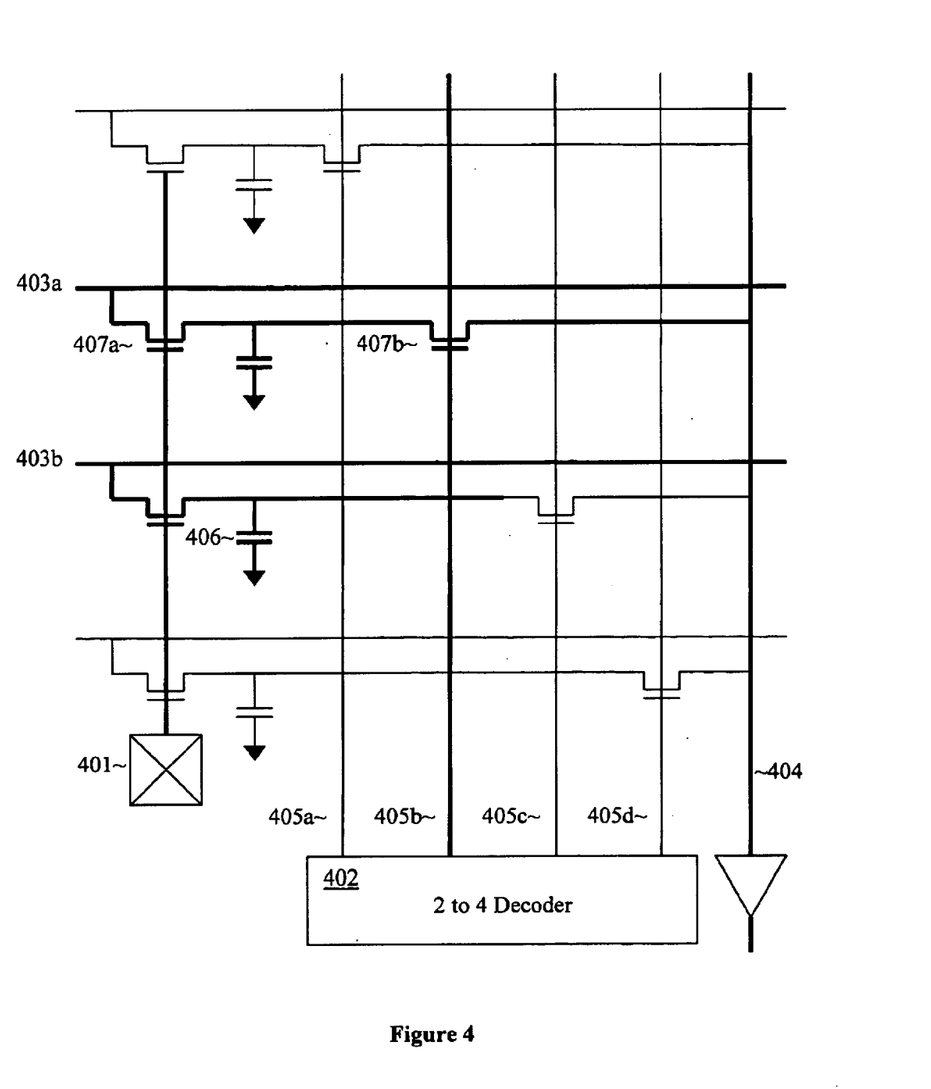
FIG. 4 illustrates the improved crossbar device of the present invention, in accordance with one embodiment.
Figure 5:
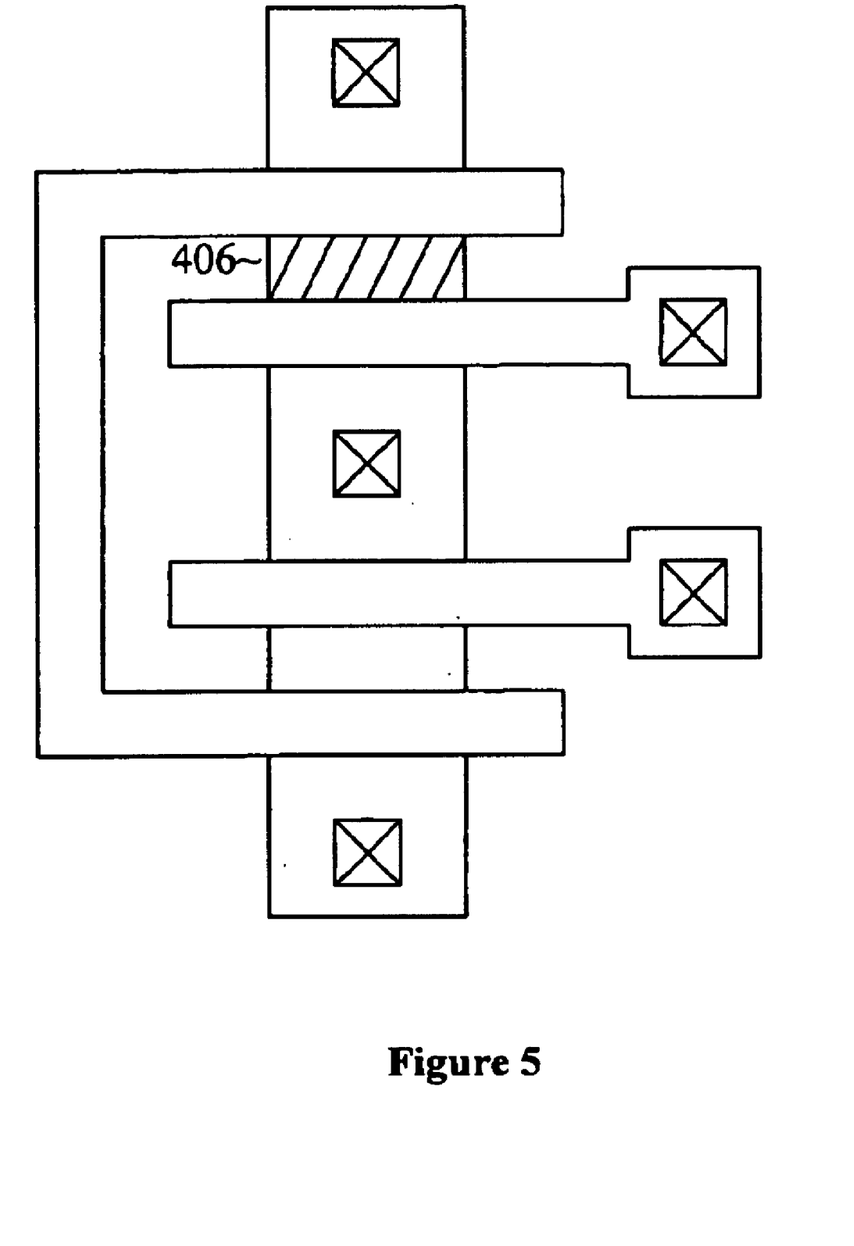
FIG. 5 illustrates the dual pass transistor layout, in accordance with one embodiment.

Referring now to FIGS. 4–5, wherein the crossbar device of the present invention, in accordance with one embodiment is shown. The crossbar device includes (n/4)×m memory elements 401 plus m 2 to 4 decoders 402 for selectively control the coupling of n inputs to m outputs. As illustrated, the crossbar device advantageously uses a dual gate pass transistor structure to minimize the parasitic capacitive loading of the input lines. Each input line, e.g. input line 403a is connected to a output line, such as output line 404, by way of a chain of pass transistors, such as pass transistors 407a and 407b.

To connect input line 403a to output line 404, a 1 is programmed in memory element 401 and the decoder 402 drives a 1 on line 405b. By programming a 1 in memory element 401 input line 403b is connected to capacitance 406. However, as a result of the dual gate pass transistor structure, parasitic capacitance 406 is reduced to a small active area as depicted on FIG. 5. Therefore, although the input line parasitic load caused by the programming pattern of the other input lines is not totally suppressed, the present invention substantially reduces it to the layout of the drain/source area while employing a small number of memory elements to realize the crossbar device.

While for ease of understanding, FIG. 4 illustrated the chain of pass transistors coupling an input line to an output line as having two pass transistors, in alternate embodiments, the present invention may be practiced with the chain as having more than two pass transistors with the first pass transistor, connected to the input line, controlled by a local memory element like 401 and the other pass transistor of the chain controlled by a decoder circuitry or memory elements.

Figure 6:
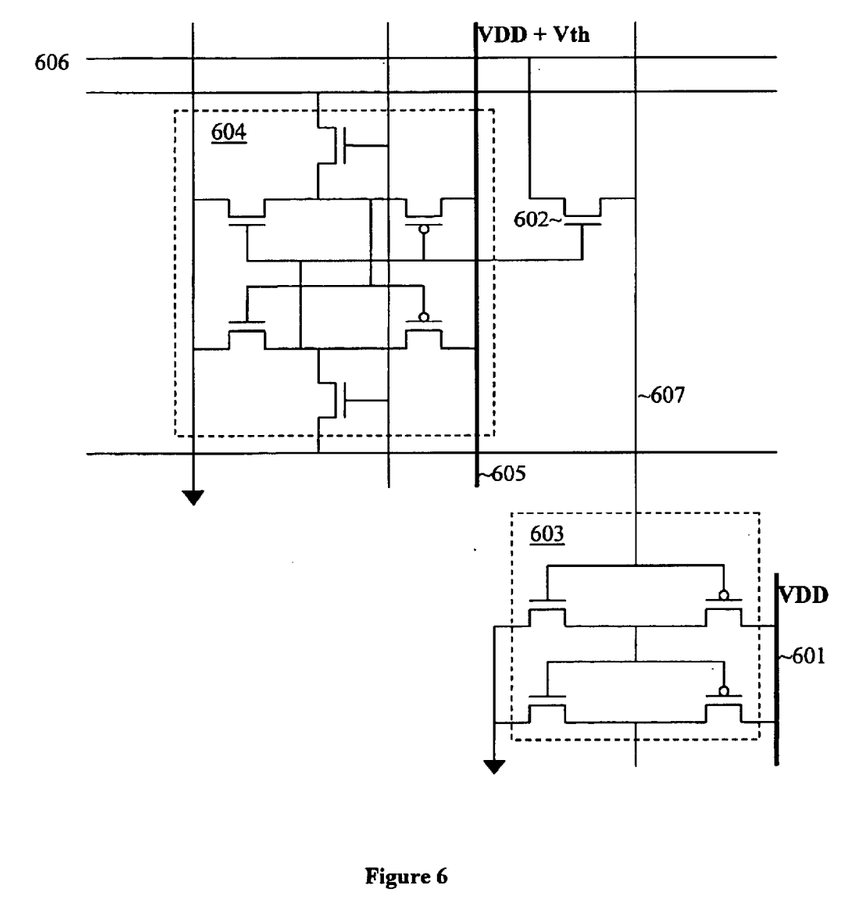
FIG. 6 illustrates a low power application of crossbar devices in a reconfigurable circuit, in accordance with one embodiment.

In low power applications where a number of crossbar devices are interconnected, it is important to reduce the voltage swing on the interconnections between the crossbar devices, to reduce the dynamic current. FIG. 6 shows a low power structure suitable for use in a crossbar device, in accordance with another aspect of the present invention. The lower power attribute is achieved by lowering the supply voltage 601 of the crossbar output buffer 603 and the additional drivers providing inputs to the various crossbar of the circuit. When a VDD level is applied on input line 606, output line 607 receives a degenerated level VDD-threshold voltage Vth, because of the Vth drop across n-mos pass transistors 602. This degenerated level when applied on the input of crossbar output buffer 603 produces a parasitic current flowing through the first inverter stage. This parasitic current, when multiplied by a significant number of crossbar output buffers of an integrated circuit block, such as a FPGA block, may ruin the low power target. As illustrated in FIG. 6, the Vth drop is advantageously compensated by raising supply voltage 605 for memory element 604 by Vth. As a result, the gate of the pass transistor 602 receives a voltage level that is one Vth above the voltage level of input line 606. However, this voltage raise does not impact the circuit power because there is no static or dynamic current in the memory element during the circuit operation. Resultantly, the crossbar output line 607 has a full VDD level.

The crossbar device may be the crossbar device of the present invention as illustrated in FIGS. 4–5. Alternatively, the crossbar device may also be a crossbar device of the prior art having the requisite memory and output buffer elements.

As alluded to earlier, employing crossbar devices in a low power manner is especially desirable for an integrated circuit or integrated circuit block where a significant number of crossbar devices are employed and interconnected. An example of such integrated circuit is the scalable reconfigurable circuit disclosed in co-pending U.S. patent application, Ser. No. 09/971,349, entitled "A Reconfigurable Integrated Circuit Having a Scalable Architecture", filed Oct. 4, 2001, having common inventorship with present application. The specification of which is hereby fully incorporated by reference.

The present invention contemplates IP blocks incorporated with the teachings of the present invention for incorporation into reconfigurable integrated circuits, as well as integrated circuits directly practicing the teachings of the present invention.

Figure 7:
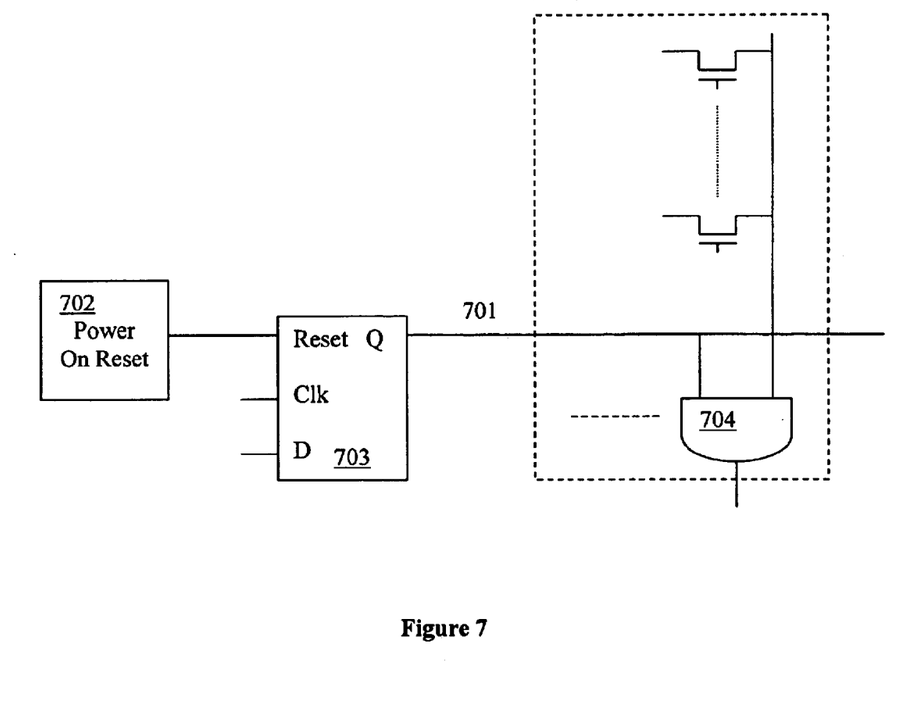
FIG. 7 illustrates a technique to improve employment of a large number of crossbar devices in a reconfigurable circuit, in accordance with one embodiment.

FIG. 7 shows an improved crossbar output buffer structure to avoid static current at power-up, in accordance with yet another aspect of the present invention. As mentioned above, at power-up, the state of the memory elements are undefined. This may create various paths between the inputs of a crossbar. For a reconfigurable circuit block, such as the one disclosed in co-pending application '349, many output buffers may be shorted together at power-up, producing a large current flow through the device. Also, during configuration loading sequence of the circuit block, the incomplete configuration may create temporary short circuits between the crossbar inputs. To compensate for these possibilities, the output buffers 704 are advantageously connected to a global control line 701 forcing their outputs to a known level. This control line is activated by a power-on reset circuitry 702 and is deactivated when a configuration has been loaded in the reconfigurable circuit block. Since all the crossbar outputs are at the same level during the power-up and until a configuration is loaded, the fact that they may or may not be shorted together does not produce any more current. For example, at power up, power on reset circuitry 702 resets the flip-flop 703. The flip-flop output 701 forces all the crossbar buffers 704 to zero. When a configuration is loaded, flip flop 702 is written with a logical 1, enabling all crossbar output buffers.

The crossbar device may be the crossbar device of the present invention as illustrated in FIGS. 4–5. Alternatively, the crossbar device may also be a crossbar device of the prior art having the requisite memory and output buffer elements. Further, the technique disclosed in FIG. 7 may also be practiced in conjunction with the voltage supply technique of FIG. 6.

As alluded to earlier, the present invention contemplates IP blocks incorporated with the teachings of the present invention-for incorporation into reconfigurable integrated circuits, as well as integrated circuits directly practicing the teachings of the present invention.

Thus an improved crossbar device with reduced parasitic capacitive loading, and improved techniques for using a significant number of crossbar devices have been disclosed. As alluded to earlier, the described embodiments are illustrative, and not restrictive. The present invention may be practiced with modifications and alterations to the described embodiments, consistent with the scope of the invention as set forth by the claims below.

What is claimed is:

1. A crossbar device comprising:

n input lines;

m output lines; and a plurality of chains of pass transistors, each chain having a plurality of pass transistors, to selectively couple said n input lines to said m output lines, wherein each of the plurality of chains of pass transistors comprises a first and a second pass transistors coupled such that said first pass transistor drives a load consisting essentially of said second pass transistors and interconnect between said first and said second pass transistor;

where n and m are integers.

2. The crossbar device of claim 1, wherein the device further comprises a plurality of memory elements coupled to the input lines.

3. The crossbar device of claim 1, wherein the device further comprises a plurality of p to q decoder logics coupled to the input lines, where p and q are integers, with p being less than q.

4. The crossbar device of claim 1, wherein each of said chains of pass transistors further comprises a memory element coupled to a pass transistor of the chain, disposed on an input side of the chain to control the chain.

5. A reconfigurable circuit comprising:

a plurality of crossbar devices coupled to one another, each crossbar device having at least a memory element, and an output buffer electrically associated with said at least a memory element; and a voltage supply structure coupled to at least one crossbar device designed to supply Vdd to an input to the output buffer and to raise a voltage raised by a threshold over Vdd to said at least a memory element to maintain an input voltage of the output buffer at Vdd.

6. The reconfigurable circuit of claim 5, wherein at least one of the plurality of crossbar devices comprises:

n input line;

m output lines; and a plurality of chains of pass transistors coupling the n input lines to the m output lines, wherein each the plurality of chains of pass transistors comprises a first and a second pass transistors coupled such that said first pass transistor drives a load consisting essentially of said second pass transistor and interconnect between said first and said second pass transistor;

where n and m are integers.

7. The reconfigurable circuit of claim 5, wherein each of the plurality of crossbar devices comprises:

n input line;

m output lines; and a plurality of chains of pass transistors coupling the n input lines to the m output lines, wherein each the plurality of chains of pass transistors comprises a first and a second pass transistor coupled such that said first pass transistor drives a load consisting essentially of said second pass transistor and interconnect between said first and said second pass transistor;

where n and m are integers.

8. The reconfigurable circuit of claim 7, wherein each of said chains of pass transistors further comprises a memory element coupled a pass transistor of the chain, disposed on an input side of the chain to control the chain.

9. The reconfigurable circuit of claim 5, wherein the reconfigurable circuit is an integrated circuit.

10. The reconfigurable circuit of claim 5, wherein the reconfigurable circuit is a block of an integrated circuit.

11. The reconfigurable logic circuit of claim 5 wherein provision of Vdd at the input voltage of the output buffer is to facilitate reduction of parasitic current flow through a first inversion stage.

12. A reconfigurable circuit comprising:

a plurality of crossbar devices coupled to one another, each crossbar device having at least an output buffer; and a power-on circuitry coupled to the crossbar devices to force the output buffers to a same known logic value at power-on, said same known logic value to facilitate reduction of current drain in said reconfigurable circuit by reducing the number of outputs of said plurality of output buffers at different logic values.

13. The reconfigurable circuit of claim 12, wherein the power-on circuitry comprises a flip-flop.

14. The reconfigurable circuit of claim 12, wherein at least one of the plurality of crossbar devices comprises:

n input line;

m output lines; and a plurality of chains of pass transistors coupling the n input lines to the m output lines, wherein each the plurality of chains of pass transistors comprises a first and a second pass transistor coupled such that said first pass transistor drives a load consisting essentially of said second pass transistor and interconnect between said first and said second pass transistor;

where n and m are integers.

15. The reconfigurable circuit of claim 12, wherein each of the plurality of crossbar devices comprises:

n input line;

m output lines; and a plurality of chains of pass transistors coupling the n input lines to the m output lines, wherein each of the plurality of chains of pass transistors comprises a first and a second pass transistor coupled such that said first pass transistor drives a load consisting essentially of said second pass transistor and interconnect between said first and said second pass transistor;

where n and m are integers.

16. The crossbar device of claim 15, wherein each of said chains of pass transistors further comprises a memory element coupled to a pass transistor of the chain, disposed on an input side of the chain to control the chain.

17. The reconfigurable circuit of claim 12, wherein each crossbar device further having at least a memory element electrically associated to an output buffer; and the reconfigurable circuit further comprises a voltage supply structure coupled to the crossbar devices designed to supply Vdd to the output buffer and to raise a voltage by a threshold over Vdd to the memory elements to maintain the voltage supply of the output buffer at Vdd.

18. The reconfigurable circuit of claim 12, wherein the reconfigurable circuit is an integrated circuit.

19. The reconfigurable circuit of claim 12, wherein the reconfigurable circuit is a block of an integrated circuit.

20. The reconfigurable circuit of claim 12, wherein the same know logic value is a logic "0".

* * * * *

UNITED STATES PATENT AND TRADEMARK OFFICE
CERTIFICATE OF CORRECTION

PATENT NO. : 6,874,136 B2
APPLICATION NO. : 10/043964
DATED : March 29, 2005
INVENTOR(S) : Frederic Reblewski et al.

It is certified that error appears in the above-identified patent and that said Letters Patent is hereby corrected as shown below:

Column 5, line 24, "transistor; where" should read --transistor and wherein a gate of the first pass transistor is coupled to a first signal and a gate of the second pass transistor is coupled to a second signal; where--.
Column 5, line 44, "raise a voltage raised by" should read --raise a voltage by--.
Column 5, line 53, "wherein each the" should read --wherein each of the--.
Column 5, line 54, "pass transistors coupled" should read --pass transistor coupled--.
Column 5, line 58, "transistor; where" should read --transistor and wherein a gate of the first pass transistor is coupled to a first signal and a gate of the second pass transistor is coupled to a second signal; where--.
Column 5, line 65, "wherein each the" should read --wherein each of the--.
Column 6, line 3, "transistor; where" should read --transistor and wherein a gate of the first pass transistor is coupled to a first signal and a gate of the second pass transistor is coupled to a second signal; where--.
Column 6, line 7, "coupled a pass" should read --coupled to a pass--.
Column 6, line 13, "reconfigurable logic circuit" should read --reconfigurable circuit--.
Column 6, line 35, "wherein each the" should read --wherein each of the--.
Column 6, line 40, "transistor; where" should read --transistor and wherein a gate of the first pass transistor is coupled to a first signal and a gate of the second pass transistor is coupled to a second signal; where--.
Column 6, line 53, "transistor; where" should read --transistor and wherein a gate of the first pass transistor is coupled to a first signal and a gate of the second pass transistor is coupled to a second signal; where--.
Column 8, line 2, "some know logic" should read --some known logic--.

Signed and Sealed this

Twenty-seventh Day of October, 2009

David J. Kappos
*Director of the United States Patent and Trademark Office*